United States Patent
Hargan

(10) Patent No.: US 8,578,591 B2
(45) Date of Patent: Nov. 12, 2013

(54) METHOD FOR MANUFACTURING A STACKED DEVICE CONDUCTIVE PATH CONNECTIVITY

(75) Inventor: Ebrahim H Hargan, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 13/299,158

(22) Filed: Nov. 17, 2011

(65) Prior Publication Data

US 2012/0060364 A1 Mar. 15, 2012

Related U.S. Application Data

(62) Division of application No. 12/242,325, filed on Sep. 30, 2008, now Pat. No. 8,063,491.

(51) Int. Cl.
*G01R 31/28* (2006.01)

(52) U.S. Cl.
USPC ............ 29/593; 29/832; 29/846; 29/850; 29/854; 257/678; 257/684; 257/685; 257/701; 257/703

(58) Field of Classification Search
USPC ............ 29/593, 832, 842, 846, 850, 854; 257/678, 684, 685, 701–703, 777
See application file for complete search history.

(56) References Cited

U.S. PATENT DOCUMENTS

| 7,400,047 | B2* | 7/2008 | Gabara | 257/777 |
| 7,816,934 | B2* | 10/2010 | Keeth | 324/750.3 |
| 7,964,946 | B2* | 6/2011 | Kwang et al. | 257/685 |
| 8,063,491 | B2 | 11/2011 | Hargan | |
| 8,134,378 | B2* | 3/2012 | Keeth | 324/750.3 |
| 2008/0296697 | A1 | 12/2008 | Hsu et al. | |
| 2009/0096478 | A1* | 4/2009 | Keeth | 324/765 |
| 2010/0059898 | A1* | 3/2010 | Keeth et al. | 257/777 |
| 2010/0078829 | A1 | 4/2010 | Hargan | |
| 2011/0018574 | A1* | 1/2011 | Keeth | 324/762.01 |

* cited by examiner

*Primary Examiner* — Paul D Kim

(74) *Attorney, Agent, or Firm* — Schwegman, Lundberg & Woessner, P.A.

(57) ABSTRACT

Various embodiments include apparatus and methods having circuitry to test continuity of conductive paths coupled to dice arranged in a stack. In at least one of these embodiments, a method includes electrically coupling each of the conductive paths to at least one of a first supply node and a second supply node. One of the conductive paths includes conductive material inside a via that can extend at least partly through a die among the dice in the stack. The method also includes receiving signals from the conductive paths, and determining continuity of the conductive paths based on the signals without using a boundary scan.

18 Claims, 6 Drawing Sheets

METHOD FOR MANUFACTURING A STACKED DEVICE CONDUCTIVE PATH CONNECTIVITY

PRIORITY APPLICATION

This application is a divisional of U.S. application Ser. No. 12/242,325, filed Sep. 30, 2008, now U.S. Pat. No. 8,063,491, which is incorporated herein by reference in its entirety.

BACKGROUND

Computers and other electronic products such as televisions, digital cameras, and cellular phones often use one or more devices to perform electrical functions. Some of these devices may include a memory device having semiconductor dice arranged in a stack. The dice may include memory cells and associated circuitry to store data and other information. The stacked device may include conductive paths to allow communication to and from the memory cells and the circuitry.

The stacked devices may also include additional circuitry such as a conventional boundary scan circuitry for testing purposes. In some cases, conventional boundary scan circuitry may increase device area, impose a higher test time delay, consume more power, and increase loading to the conductive paths.

DETAILED DESCRIPTION

Figure 1:
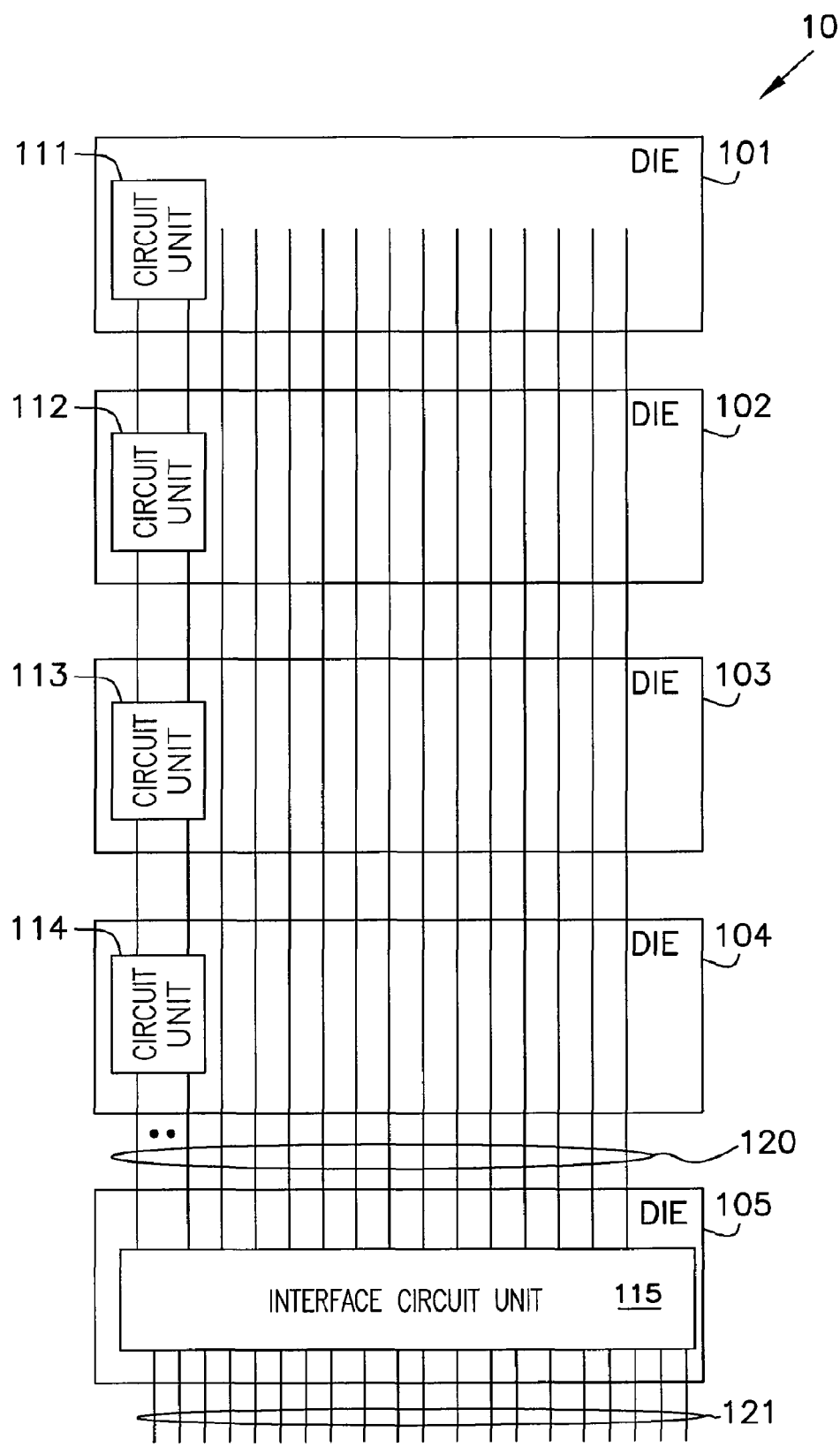
FIG. 1 is a block diagram of an apparatus including dice and conductive paths according to various embodiments of the invention.

FIG. 1 is a block diagram of an apparatus 100 including dice 101, 102, 103, 104, and 105 and conductive paths 120 and 121 according to various embodiments of the invention. Dice 101 through 105 may form a memory device and communicate with each other through conductive paths 120 and with other external devices, e.g., processors, memory controllers, or other, through an interface circuit unit 115 and conductive paths 121. Conductive paths 120 and 121 may transfer information such as data, address, control and other information. FIG. 1 shows conductive paths 120 and 121 with a specific number of paths as an example. The number of paths may vary.

Each of dice 101 through 105 may include semiconductor material, such as silicon, where circuit components are located. These dice may be physically arranged in a stack and conductive paths 120 and 121 may run through the bodies of the dice. Conductive paths 120 and 121 may include conductive material filled in vias formed in the dice. The vias may sometimes be called through silicon vias or through holes.

The inventor has noticed that the continuity of one or more of conductive paths 120 may be affected during or after manufacturing of apparatus 100 such that one or more of conductive paths 120 may fail to carry electrical signals or may carry electrical signals inefficiently. The inventor has invented, as described below, techniques to determine the conductivity of conductive paths 120. Apparatus 100 may include or exclude boundary scan circuitry. Those skilled in the art would recognize that a device, such as the one in apparatus 100, may include boundary scan circuitry for testing various characteristics of the device. In FIG. 1, apparatus 100 may determine the continuity of conductive paths, such as conductive paths 120, with or without involving boundary scan circuitry even if apparatus 100 may include boundary scan circuitry, which may be used for other testing purposes besides a continuity test.

As shown in FIG. 1, dice 101, 102, 103, and 104 may include circuit units 111, 112, 113, and 114, respectively. These circuit units may combine with at least a portion of interface circuit unit 115 to form at least a portion of a module that apparatus 100 may use to determine the continuity of conductive paths 120 during a test. For clarity, FIG. 1 omits details of circuit units 111, 112, 113, and 114. These circuit units, however, may include circuit elements such as transistors, select elements, and other circuit elements with functions that are similar to or identical to those of the apparatus shown in FIG. 3.

In FIG. 1, interface circuit unit 115 may include components such as logic circuitry and other components to control communication to and from dice 101 through 105 during a normal operation or during a test. Interface circuit unit 115 may provide testing information to and receive test results from die 101, 102, 103, and 104 during a test such as a test for the continuity of conductive paths 120. Interface circuit unit 115 may also include components to repair conductive paths 120 when one or more of these conductive paths are deemed to be defective based on a test such as a continuity test. Apparatus 100 may include various operating mode such as a test mode, a normal operating mode, and other operating modes. The test mode may occur when apparatus 100 is being tested at a manufacturer before it is installed in an electronic product or system. The test mode may also occur after apparatus 100 it is installed in an electronic product or system. For example, during or after power-up or initialization process, apparatus 100 may enter the test mode to self test its components including testing the continuity of conductive paths, such as conductive paths 120. Apparatus 100 of FIG. 1 may include embodiments of FIG. 2 through FIG. 4 described below.

Figure 2:
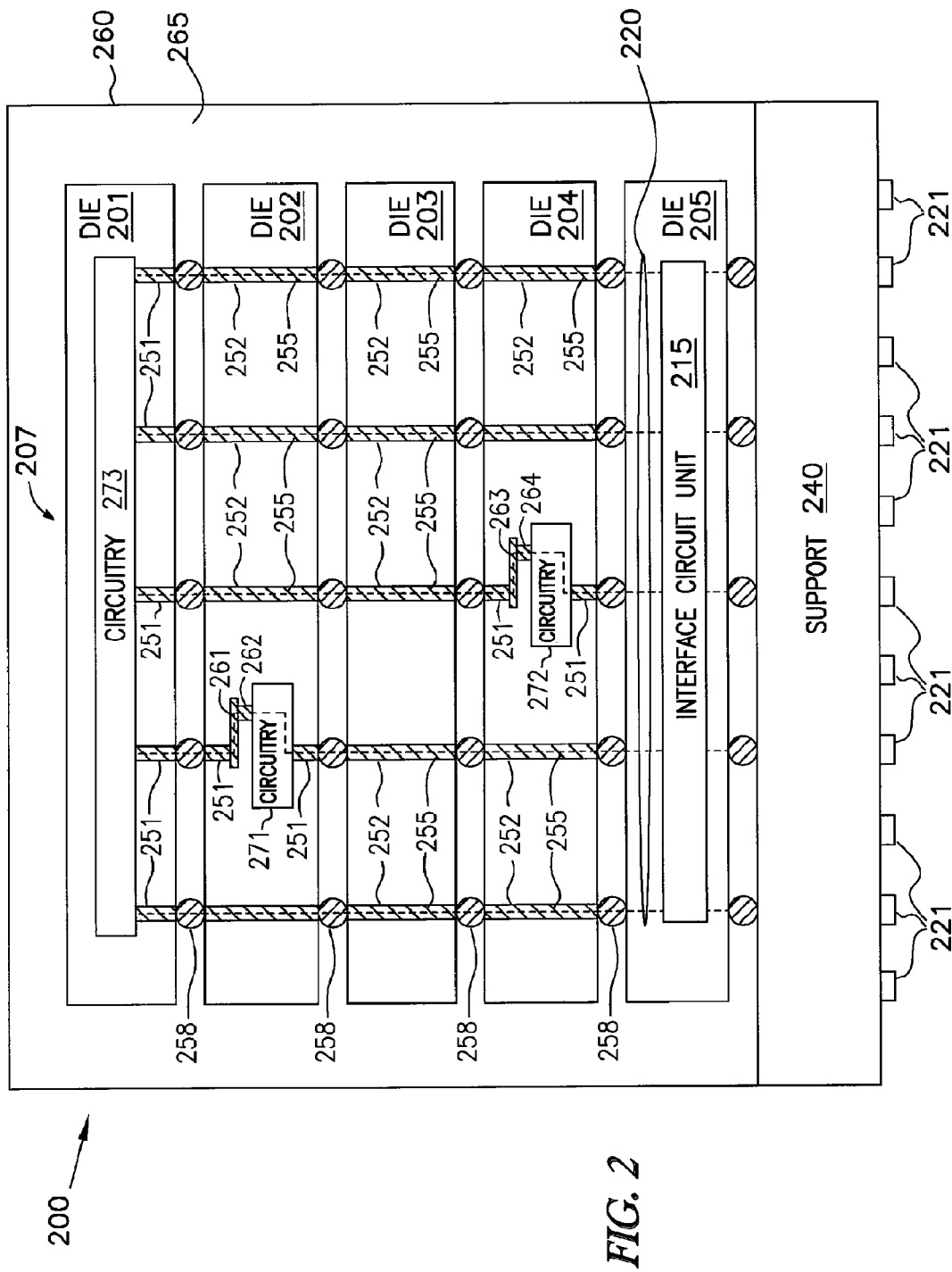
FIG. 2 shows a partial cross section of a stacked device having dice arranged in a stack and conductive paths according to various embodiments of the invention.

FIG. 2 shows a partial cross section of a stacked device 200 having dice 201, 202, 203, 204, and 205 arranged in a stack 207 and conductive paths 220 according to various embodiments of the invention. Conductive paths 220 are symbolically shown by broken lines in FIG. 2 and may be represented in block diagram such as the block diagram of conductive paths 120 of FIG. 1. In FIG. 2, conductive paths 220 may include a combination of vias 251, 252, conductive material 255, joints 258, and other conductive paths within circuitry 271, 272, and 273. FIG. 2 shows three circuitries 271, 272, and 273 of stacked device 200 as examples. Stacked device 200, however, may include other circuitry and components, which are omitted from FIG. 2 to illustrate the embodiments herein. For example, dice 201 through 205 may form a memory device having circuit components such as memory cells, decode circuits, control circuits, and other components. Interface circuit unit 215 may include circuit component (e.g., buffers and I/O drivers) to accommodate the transfer of information at appropriate data transfer rates between stacked device 200 and another device such as a processor or a memory controller.

Stacked device 200 may also be called an integrated circuit (IC) chip where dice 201 through 205 are inside the IC chip. Stacked device 200 may include a support 240, which may include a ceramic or organic substrate. Contacts 221 may be coupled to support 240 to enable stacked device 200 to communicate with another device such as a processor or a memory controller. Contacts 221 may be a part of conductive paths such as conductive paths 121 of FIG. 1. In FIG. 2, stacked device 200 may include an enclosure 260, which may enclose at least a portion of support 240, dice 201 through 205, and an interior 265. Interior 265 may be filled with a filling material, a gas, a liquid, or a combination thereof. The filling material may include a polymer material. Stacked device 200 may be formed using techniques known to those skilled in the art. For example, stacked device 200 may be formed using flip-chip techniques.

As shown in FIG. 2, each via 251 may extend partly through the die such as through die 201, 202, or 204. Each via 252 may extend entirely through the die such as through each of die 202, 203, and 204. Stacked device 200 may include conductive portions 261 and 262 coupled to circuitry 271 and vias 251 of die 202 such that the two vias 251 on both sides of circuitry 271 may be coupled by conductive portions 261 and 262. Stacked device 200 may also include conductive portions 263 and 264 coupled to circuitry 272 and vias 251 of die 204 such that the two vias 251 on both sides of circuitry 272 may be coupled by conductive portions 263 and 264.

Stacked device 200 may also include circuit units that are similar to or identical to circuit units 111 through 114 of FIG. 1 to allow stacked device to determine the continuity of conductive paths 220 during a test. FIG. 2 omits these circuit units for clarity. In some cases, one or more of the following conditions may occur to conductive paths 220 such as: an inadequate amount of conductive material inside vias 251 or 252, causing one or more of conductive paths 220 to be highly resistive; a gap within the conductive material, causing one or more of conductive paths 220 to be open; a short circuit to ground; a short circuit to supply power (e.g., Vcc), and/or other conditions. When one or more of these conditions occurs at a particular conductive path among conductive paths 220, the particular conductive path is said to be affected such that it may be deemed to be defective or may become defective. Stacked device 200 may include a module to determine the conductivity of conductive paths 220 and repair defective conductive paths. Stacked device 200 may include various embodiments described below with reference to FIG. 3.

Figure 3:
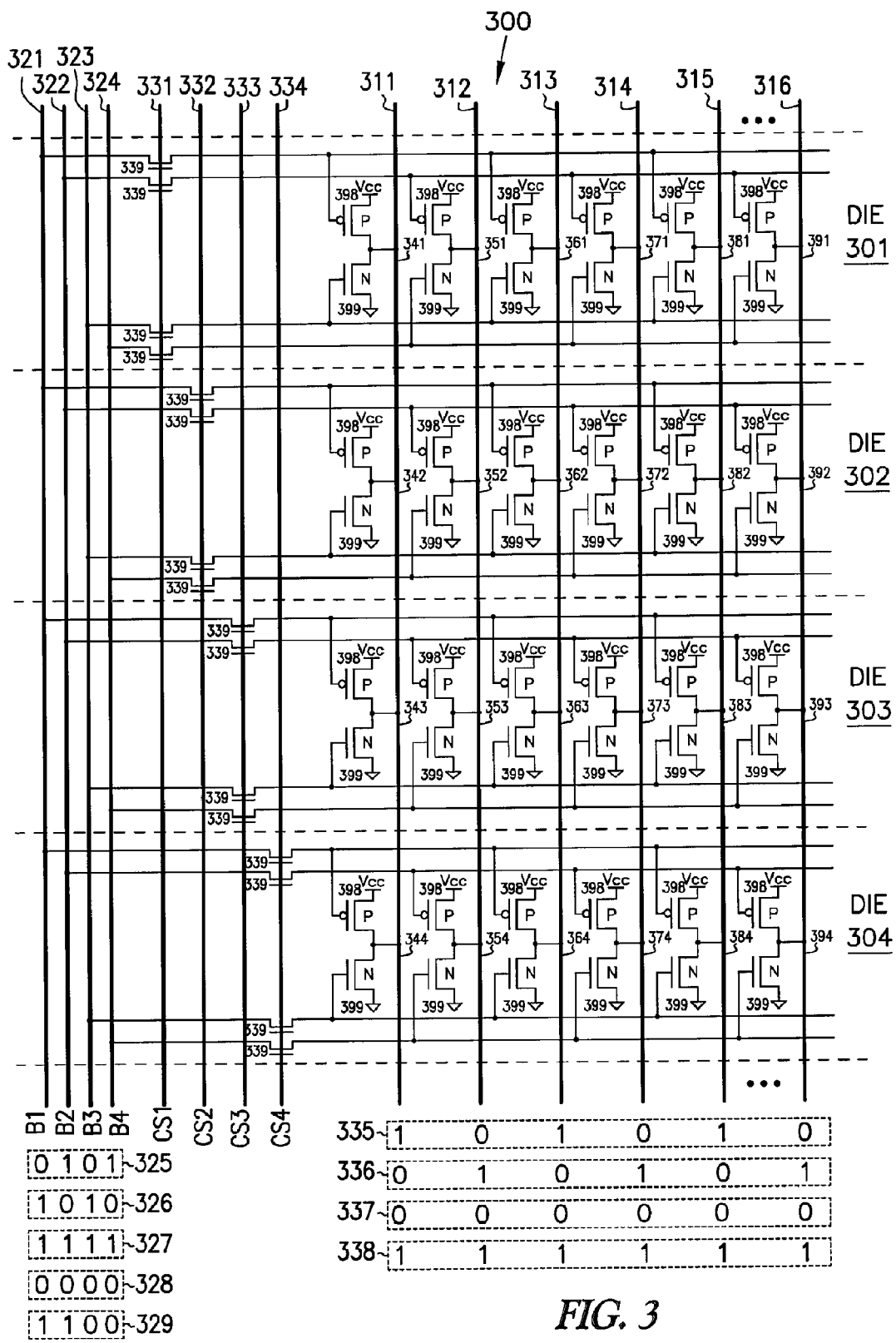
FIG. 3 shows a partial schematic diagram of an apparatus including dice according to various embodiments of the invention.

FIG. 3 shows a schematic diagram of an apparatus 300 including dice 301, 302, 303, and 304 according to various embodiments of the invention. Apparatus 300 may include conductive paths 311, 312, 313, 314, 315, 316, 321, 322, 323, 324, 331, 332, 333, and 334, which may correspond to conductive paths 120 of FIGS. 1 and 220 of FIG. 2. Conductive paths 311 through 316 may transfer information to and from dice 301 through 304, such as data, address, control, and other information.

Apparatus 300 may include transistors P and N and select elements 339, which together with conductive paths 321, 322, 323, 324, 331, 332, 333, and 334 may form at least a portion of a module that apparatus 300 may use during a test to determine a continuity of conductive paths 311 through 316. Since apparatus 300 may use conductive paths 321, 322, 323, 324, 331, 332, 333, and 334 during a test to test the continuity of conductive paths 311 through 316, conductive paths 321, 322, 323, 324, 331, 332, 333, and 334 are assumed to be non-defective when the test occurs. To reduce the chance of conductive paths 321, 322, 323, 324, 331, 332, 333, and 334 being non-defective, apparatus 300 may include, e.g., duplicates of each of conductive paths 321, 322, 323, 324, 331, 332, 333, and 334, such that if one or more of conductive paths 321, 322, 323, 324, 331, 332, 333, and 334 are defective, their duplicates may still be non-defective.

Apparatus 300 may include an interface circuit unit that is not shown in FIG. 3 but may be similar to or identical to interface circuit unit 115 of FIG. 1 or interface circuit unit 215 of FIG. 2. The interface circuit unit may control communication to and from apparatus 300 including control of testing for continuity of conductive paths 311 through 316.

During a test, apparatus 300 may alternately and electrically couple different groups of conductive paths among conductive paths 311 through 316 to supply nodes 398 and 399 to determine the continuity of these conductive paths. For example, in a test, apparatus 300 may concurrently and electrically couple a group of conductive paths 311, 313, and 315 (e.g., odd paths) to supply node 398 (e.g., Vcc) and a group of conductive paths 312, 314, and 316 (e.g., even paths) to supply node 399 (e.g., ground). Then, in another test, apparatus 300 may switch the coupling such that it may concurrently and electrically couple conductive paths 311, 313, and 315 to supply node 399 and conductive paths 312, 314, and 316 to supply node 398. In other tests, apparatus 300 may electrically couple all of conductive paths 311 through 316 either to supply node 398 or to supply node 399. Apparatus 300 may determine the continuity of conductive paths 311 through 316 based one or more tests such as the tests described herein. For example, from one or more or the four tests described herein, apparatus 300 may determine whether one or more of conductive paths 311 through 316 is affected such as having a relatively high resistance, a gap in the conductive material, a short circuit to ground, a short circuit to supply power such as Vcc, or a combination thereof. Apparatus 300 may include a repair module to repair the affected conductive path using repair techniques known to those skilled in the art. For example, apparatus 300 may replace the affected conductive path with a spare conductive path or reroute at least a segment of the affected conductive path to another conductive path.

In this description, "electrically coupled", "electrically couple", or "electrically coupling" means intentionally creating an electrical conduction between two or more elements such as between a supply node and a conductive path or such as between a source and a drain of a transistor so that electric conduction may also occur between other elements (e.g., a supply node and a conductive path) that are coupled to the source and drain of a transistor. Further, in this description, "coupled", "couple", or "coupling" when used alone, without the word "electrically" next to it, refers to direct or indirect physical attachments between two or more elements. Thus, one or more first elements may be coupled to one or more second elements but the first and second elements may not be electrically coupled to each other at a specific time because electrical conduction may not be created between the first and second elements at that specific time.

During a test, apparatus 300 of FIG. 3 may apply signals CS1, CS2, CS3, and CS4 to conductive paths 331, 332, 333, and 334 to turn on select elements 339, which may include transistors coupled as shown in FIG. 3. Select elements 339 may pass information, such as signals B1, B2, B3, and B4, from conductive paths 321, 322, 323, and 324 to the gates of transistors P and N to selectively turn on or off transistors P and N, depending on the values of signals B1, B2, B3, and B4 at conductive paths 321, 322, 323, and 324. The B1, B2, B3, and B4 signals may include a number of different test patterns at different times. FIG. 3 shows four different test patterns 325, 326, 327, and 328 as an example. However, a different number of patterns may be used. As shown in FIG. 3, during a test, patterns 325, 326, 327, and 328 may have different values represented by four combinations of bits 0101, 1010, 1111, and 0000, respectively. During a test, these four combinations may cause different combinations of transistors P and N to turn on or off to selectively and electrically couple conductive paths 311 through 316 to supply nodes 398 and 399. During a normal operation, apparatus 300 may use pattern 329 having bits 1100 to turn off transistors P and N to prevent conductive paths 311 through 316 from electrically coupling to supply nodes 398 and 399.

As shown in FIG. 3, patterns 335, 336, 337, and 338 may have values that are represented by combinations of bits 101010, 010101, 000000, and 111111, respectively. These combinations of bits are expected values that conductive paths 311 through 316 may provide (e.g., output) during a test when corresponding patterns 325, 326, 327 and 328 with combinations of bits 0101, 1010, 1111, and 0000, respectively, are used. Each bit within each of combinations of bits 101010, 010101, 000000, and 111111 may represent an expected value of a corresponding conductive path when the corresponding conductive path is coupled to supply node 398 or 399. For example, when pattern 325 having bits 0101 are used during a test, conductive paths 311, 312, 313, 314, 315, and 316 are expected to have values of 1010101, respectively. The expected values are independent of the number of dice selected during the test because conductive paths 311 through 316 extend through all of these dice. Thus, during a test, apparatus 300 may activate one more of the CS1, CS2, CS3, and CS4 signals to select one or more of dice 301 through 304. The expected values may remain at one of the combinations of bits 101010, 010101, 000000, or 111111 (depending on which one of the patterns 325, 326, 327, or 328 is used during the test) regardless of the number of dice being selected for the test.

Apparatus 300 may use an interface circuit unit (not shown in FIG. 3) to receive the values of the combination of bits of patterns 335, 336, 337, and 338 from conductive paths 311 through 316. The interface circuit unit of apparatus 300 may compare the received values with expected values to determine whether the received values match the expected values. A mismatch between the received values and the expected value may indicate that the continuity of one or more of conductive paths 311 through 316 may be affected such that a discontinuity in a conductive path may occur, for example, a short circuit from a conductive path to a supply node such as supply node 398 or 399 may occur.

For example if apparatus 300 uses pattern 325 having bits 0101 during a test, then conductive paths 311 through 316 may provide pattern 335 having an expected value of bits 101010. If pattern 335 has a value different from 101010, then one or more of conductive paths 311 through 316 may be affected. For example, if apparatus 300 uses pattern 325 having bits 0101 and if conductive paths 311, 312, 313, 314, 315, and 316 provide a value of 111010, respectively, instead of an expected value of 101010 (as shown in FIG. 3), then conductive path 312 (which provides the second bit 1 from the left side of bits 111010) may be affected. In this example, since conductive path 312 has a bit 1 value, it may have a short circuit to supply node 398 (e.g., Vcc) because the value of supply node 398 may be set to be equivalent to "1". In this example, conductive path 312 may have a short circuit to a node different from supply node 398 in which the value that node may also be equivalent to "1". In another example, if apparatus 300 uses pattern 325 having bits 0101 and if conductive lines 311, 312, 313, 314, 315, and 316 provide a value of 001010, respectively, instead of an expected value of 101010 as shown in FIG. 3, then conductive path 311 (which provides the first bit 0 from the left side of bits 001010) may be affected. In this example, since conductive path 311 has a bit 0 value, it may have a short circuit to supply node 399 (e.g., ground) because the value of supply node 399 may be set to be equivalent to "0". In a further example, if neither bit 0 nor bit 1 can be obtained from a particular conductive path during a test, meaning that the bit value is undefined, then the particular conductive path may have a high resistance or a gap in its conductive material. Apparatus 300 may include a module to repair the affected conductive path when it is found to be affected.

As shown in FIG. 3, conductive path 311 may include a number of segments 341, 342, 343, and 344, each being located at a different die among dice 301 through 304. Similarly, each of conductive paths 312 through 316 may include a number of segments located at different die of the dice 301 through 304. For example, conductive path 312 may include segments 351, 352, 353, and 354 located at dice 301, 302, 303, and 304, respectively. Conductive path 313 may include segments 361, 362, 363, and 364 located at dice 301, 302, 303, and 304, respectively. Conductive path 314 may include segments 371, 372, 373, and 374 located at dice 301, 302, 303, and 304, respectively. Conductive path 315 may include a number of segments 381, 382, 383, and 384 located at dice 301, 302, 303, and 304, respectively. Conductive path 316 may include segments 391, 392, 393, and 394 located at dice 301, 302, 303, and 304, respectively.

In the description above, apparatus 300 may apply the CS1, CS2, CS3, and CS4 signals in ways such that select elements 339 located at all dice 301 through 304 may turn on at the same time to select all of these dice to test the continuity of conductive paths 311 through 316. For example, apparatus 300 may apply the CS1, CS2, CS3, and CS4 signals with bits 1111 to select all dice 301 through 304 at the same time. Alternatively, apparatus 300 may apply the CS1, CS2, CS3, and CS4 signals in ways such that select elements 339 at only die 301 may turn on to test the continuity of conductive paths 311 through 316. For example, apparatus 300 may activate only the CS1 signal and deactivate the CS2, CS3, and CS4 signal (e.g., apply bit values 1000 to the CS1, CS2, CS3, and CS4 signals, respectively) such that select elements 339 at only die 301 turn on to pass the information on conductive paths 321, 322, 323, and 324 to the gates of transistors P and N at only die 301. Thus, all dice 301, 302, 303, and 304 or only die 301 may be selected during a test to test the continuity of conductive paths 311 through 316.

Apparatus 300 may also test any segments in any die by selecting a specific die where the segments to be tested are located; if the specific die is not the die (e.g., not die 304) closest to an interface circuit unit (e.g., interface circuit similar to 115 of FIG. 1 or 215 of FIG. 2), apparatus 300 may also select one more additional dice during the test, depending on the location of the specific die. For example, to test segments 343, 353, 363, 373, 383, and 393 of die 303, apparatus 300 may first apply bit values 0010 to the CS1, CS2, CS3, and CS4 signals, respectively, such that select elements 339 at only die 303 turn on to pass the information on conductive paths 321, 322, 323, and 324 to the gates of transistors P and N at only die 303. First values of the combination of bits of patterns 335, 336, 337, and 338 from conductive paths 311 through 316 may be obtained. Then, apparatus 300 may apply bit values 0001 to the CS1, CS2, CS3, and CS4 signals, respectively, such that select elements 339 at only die 304 turn on to pass the information on conductive paths 321, 322, 323, and 324 to the gates of transistors P and N at only die 304. Second values of the combination of bits of patterns 335, 336, 337, and 338 from conductive paths 311 through 316 may be obtained. Based on the first values and the second values, condition (e.g., continuity) of only segments 343, 353, 363, 373, 383, and 393 of die 303 may be evaluated.

Using the above techniques, apparatus 300 may test the continuity of conductive paths 311 through 316 by selecting one die at a time or by selecting any number of dice at a time by applying appropriate values for signals CS1, CS2, CS3, and CS4.

The techniques described above allow apparatus 300 to selectively test any segment of conductive paths 311 through 316 at any die. The ability of apparatus 300 to test any segment of conductive paths 311 through 316 in any die may be useful to identify which segment of which conductive path is affected. Knowing a specific location of an affected segment can be used for further device analysis and/or design improvement.

Apparatus 300 may use transistors P and N to electrically couple one or more segments of a conductive path among conductive paths 311 through 316 to either supply node 398 or 399 during a test. Transistors P and N may include different types of transistors. For example, transistor P may include a p-channel metal-oxide-semiconductor transistor (or PMOS transistor), and transistor N may include an n-channel metal-oxide-semiconductor transistor (or NMOS transistor). Other types of transistors may be used. Apparatus 300 may use transistors P to electrically couple conductive paths 311 through 316 to supply node 398 at one time and use transistors N to electrically couple conductive paths 311 through 316 to supply node 399 at another time.

As shown in FIG. 3, each transistor P may include a terminal coupled to one of the conductive paths 311 to 316, a terminal coupled to supply node 398, and a gate coupled to conductive path 321 or 322 through a corresponding select element 339. Apparatus 300 may electrically couple a particular segment of a particular die to supply node 398 through a corresponding transistor P coupled to that particular segment. The connection between each transistor P and supply node 398 and a corresponding conductive path as shown in FIG. 3 are referred to as a direct connection of the transistor between supply node 398 and the corresponding conductive path.

Each transistor N may include a terminal coupled to one of the conductive paths 311 to 316, a terminal coupled to supply node 399, and a gate coupled to conductive path 323 or 324 through a corresponding select element 339. Apparatus 300 may electrically couple a particular segment of a particular die to supply node 399 through a corresponding transistor N coupled to that particular segment. The connection between each transistor N and supply node 399 and a corresponding conductive path as shown in FIG. 3 referred to as a direct connection of the transistor between supply node 399 and the corresponding conductive path.

Apparatus 300 may electrically couple a particular segment to one (not both) of supply nodes 398 and 399 at a time. For example, at one time, apparatus 300 may electrically couple segment 341 to supply node 398 using the transistor P that is coupled to segment 341. At another time, apparatus 300 may electrically couple segment 341 to supply node 399 using the transistor N that is coupled to segment 341. Similarly, apparatus 300 may electrically couple any segment of other conductive paths 312, 313, 314, 315, and 316 either to supply node 398 through a corresponding transistor P or to supply node 399 through a corresponding transistor N.

As described above, apparatus 300 may use four patterns 325, 326, 327, and 328 to test the continuity of conductive paths 311 through 316. The number of patterns (e.g., four) used by apparatus 300 may be less than that used by other conventional techniques to test the continuity of conductive paths such as conductive paths 311 through 316. For example, to test the continuity of N conductive paths such as conductive paths 311 through 316, where N is greater than two, some conventional techniques that involve boundary scan may use more than four patterns and up to $2^N$ patterns. In apparatus 300, the number of patterns may be less than $2^N$. Fewer patterns may reduce test time and/or production time of a device such as a memory device included in apparatus 300.

Further, since only two transistors (P and N) are coupled to a segment of a conductive path in each of dice 301 through 304, only four bits may be used for each of patterns 325, 326, 327, and 328 to turn on transistors P and N to electrically couple conductive paths 311 to supply nodes 398 and 399 in a fashion described above. Thus, in apparatus 300, only four conductive paths, such as conductive paths 321, 322, 323, and 324 may be used to apply four bits of each of patterns 325, 326, 327, and 328 to test the continuity of N conductive paths such as conductive paths 311 through 316, where N is greater than 4. FIG. 3 shows six conductive paths 311 through 316 as an example. The dots between conductive path 315 and 316 are used to indicate that the number of conductive paths 311 through 316 (or N conductive paths) may be numerous such as hundreds or thousands.

Some conventional techniques may use more than four bits in each pattern to test the continuity of N conductive paths, where N is greater than 4. Thus, some conventional techniques use more than four conductive paths to apply the bits of each pattern. In apparatus 300 of FIG. 3, however, fewer number of conductive paths, such as conductive paths 321, 322, 323, and 324, may allow apparatus 300 to have a relatively smaller device area, a lighter load on conductive paths 311 through 316, a lower power consumption, and/or a lower test time delay.

The description above with reference to FIG. 3 describes various activities that apparatus 300 may perform to test the continuity of conductive paths 311 through 316 by, for example, selectively and electrically coupling conductive paths 311 through 316 to supply nodes 398 and 399 through transistors P and N. Apparatus 300 may have no other use for transistors P and N besides using these transistors for testing purposes, as described above. Thus, in a normal operation after the test, apparatus 300 may disable transistors P and N so that transistors P and N may turn off when power is applied to apparatus 300 to prevent conductive paths 311 through 316 from electrically coupling to supply nodes 398 and 399 through transistors P and transistors N.

As an example, in a normal operation, apparatus 300 may hold the gate of each transistor P and each transistor N at a fixed voltage when the power is applied to apparatus 300, such as when apparatus 300 is powered up. Since transistors P and N have different transistor types, apparatus 300 may hold the gate of each transistor P and each transistor N at different voltage values to turn off transistors P and N. For example, apparatus 300 may hold the gate of each transistor P at a fixed voltage equal to Vcc and hold the gate of each transistor N at a fixed voltage equal to a ground potential. Apparatus 300 may use a different module or the same module that it uses for the test to apply appropriate voltage to the gates of transistors P and N to turn them off. For example, apparatus 300 may include a module with an interface circuit unit that is not shown in FIG. 3 but may be similar to or identical to interface circuit unit 115 of FIG. 1 or interface circuit unit 215 of FIG. 2 to apply appropriate voltage to the gates of transistors P and N to turn them off during a normal operation. For example, the module of apparatus 300 may apply pattern 329 having bit 1100 to signals B1, B2, B3, and B4 and apply bits 1111 to signals C1, C2, C3, and C4 so that the gate of each of transistors P may be fixed at value "1" (e.g., Vcc) and the gate of each of transistors N may be fixed at "0" (e.g., ground). At these corresponding fixed values, transistors P and transistors N may be turned off to prevent conductive paths 311 through 316 from electrically coupling to supply nodes 398 and 399.

Figure 4:
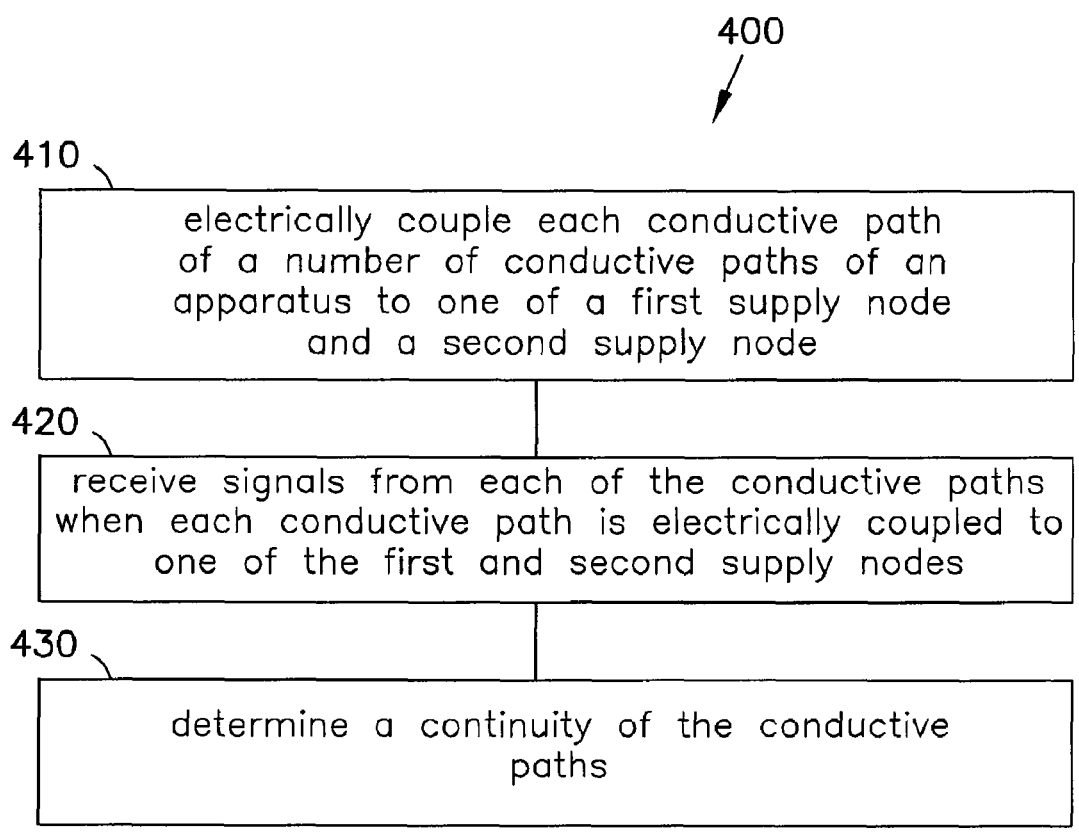
FIG. 4 is a flow diagram showing a method of determining continuity of conductive paths in an apparatus according to various embodiments of the invention.

FIG. 4 is a flowchart showing a method of determining continuity of conductive paths in an apparatus according to various embodiments of the invention. Method 400 may be used in an apparatus such as apparatus 100 of FIG. 1, apparatus 300 of FIG. 3, or stacked device 200 of FIG. 2. Thus, the components of the apparatus used in method 400 may include the components of apparatus 100 of FIG. 1, apparatus 300 of FIG. 3, or stacked device 200 of FIG. 2.

Activity 410 of method 400 may include electrically coupling each conductive path of a number of conductive paths of an apparatus to one of a first supply node and a second supply node. One of the conductive paths may include conductive material inside a via that extend at least partly through a die of a number of dice arranged in a stack. Activity 420 may include receiving signals from each of the conductive paths when each conductive path is electrically coupled to one of the first and second supply nodes. Activity 430 may include determining a continuity of the conductive paths. Activity 430 may determine the continuity of the conductive paths without using boundary scan. Method 400 may include other activities similar to or identical to the activities of determining continuity of conductive paths such as conductive paths 120, 220, and 230 described above with reference to FIG. 1 through FIG. 3.

Figure 5:
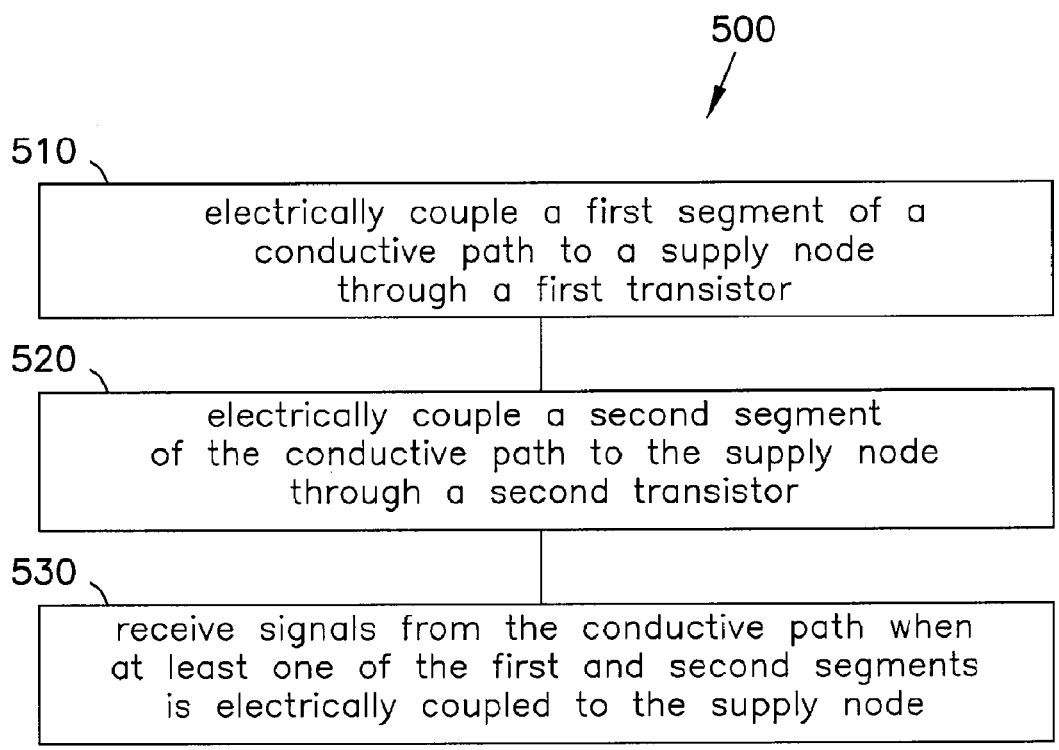
FIG. 5 is a flow diagram showing a method of electrically coupling conductive paths to supply nodes in an apparatus according to various embodiments of the invention.

FIG. 5 is a flowchart showing a method of electrically coupling conductive paths to supply nodes in an apparatus according to various embodiments of the invention. Method 500 may be used in an apparatus such as apparatus 100 of FIG. 1, apparatus 300 of FIG. 3, or stacked device 200 of FIG. 2. Thus, the components of the apparatus used in method 500 may include the components of apparatus 100 of FIG. 1, apparatus 300 of FIG. 3, or stacked device 200 of FIG. 2.

Activity 510 of method 500 may include electrically coupling a first segment of a conductive path to a supply node through a first transistor. The first segment may be located at a first die of a number of dice arranged in a stack. Activity 520 may include electrically coupling a second segment of the conductive path to the first supply node through a second transistor. The second segment may be located at a second die of the dice. Activity 530 may include receiving signals from the conductive paths when at least one of the first and second segments is electrically coupled to at least one of the first and second supply nodes. Method 500 may include other activities similar to or identical to the activities described above with reference to FIG. 1 through FIG. 3.

Figure 6:
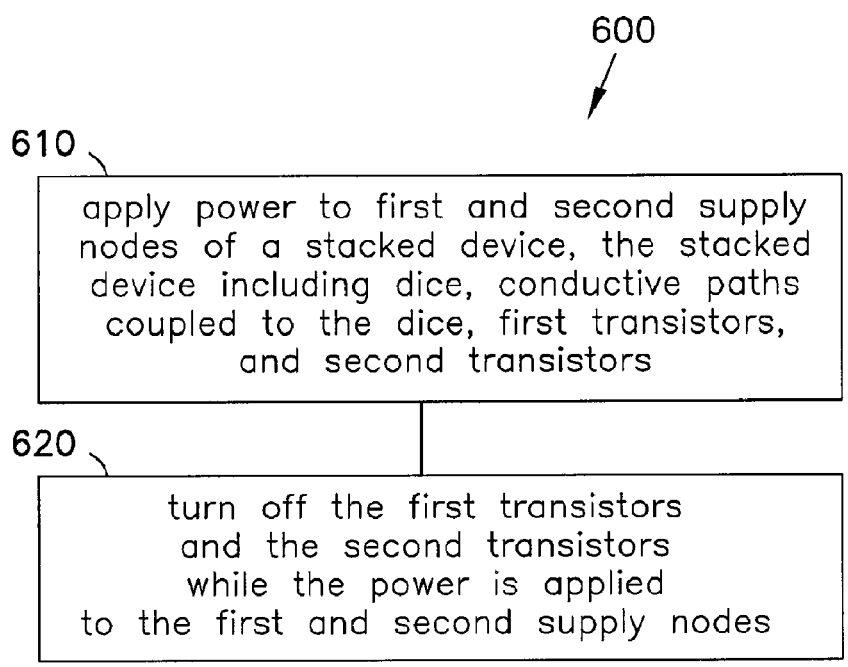
FIG. 6 is a flow diagram showing a method of operating an apparatus according to various embodiments of the invention.

FIG. 6 is a flowchart showing a method of operating an apparatus according to various embodiments of the invention. Method 600 may be used in an apparatus such as apparatus 100 of FIG. 1, apparatus 300 of FIG. 3, or stacked device 200 of FIG. 2. Thus, the components of the apparatus used in method 600 may include the components of apparatus 100 of FIG. 1, apparatus 300 of FIG. 3, or stacked device 200 of FIG. 2.

Activity 610 of method 600 may include applying power to first and second supply nodes of a stacked device. The stack may include dice and conductive paths coupled to the dice. The stack may also include first transistors and second transistors. Each of the first transistors may be directly coupled between the first supply node and one of the conductive paths. Each of the second transistors may be directly coupled between the second supply node and one of the conductive paths. In this description, a transistor is said to be directly coupled between means the a supply node and a conductive path refers to a connection as shown in FIG. 3 such that a first non-gate terminal (e.g., a source) a second non-gate terminal (e.g., drain) of the transistor are coupled to the supply node and the conductive path, respectively, without going through another circuit element such as another transistor, resistor, capacitor, or other elements besides conductive paths or traces.

Activity 620 of method 600 may include turning off the first transistors and the second transistors while the power is applied to the first and second supply nodes. Method 600 may include other activities similar to or identical to the activities of determining continuity of conductive paths such as conductive paths 120, 220, and 230 described above with reference to FIG. 1 through FIG. 3.

Figure 7:
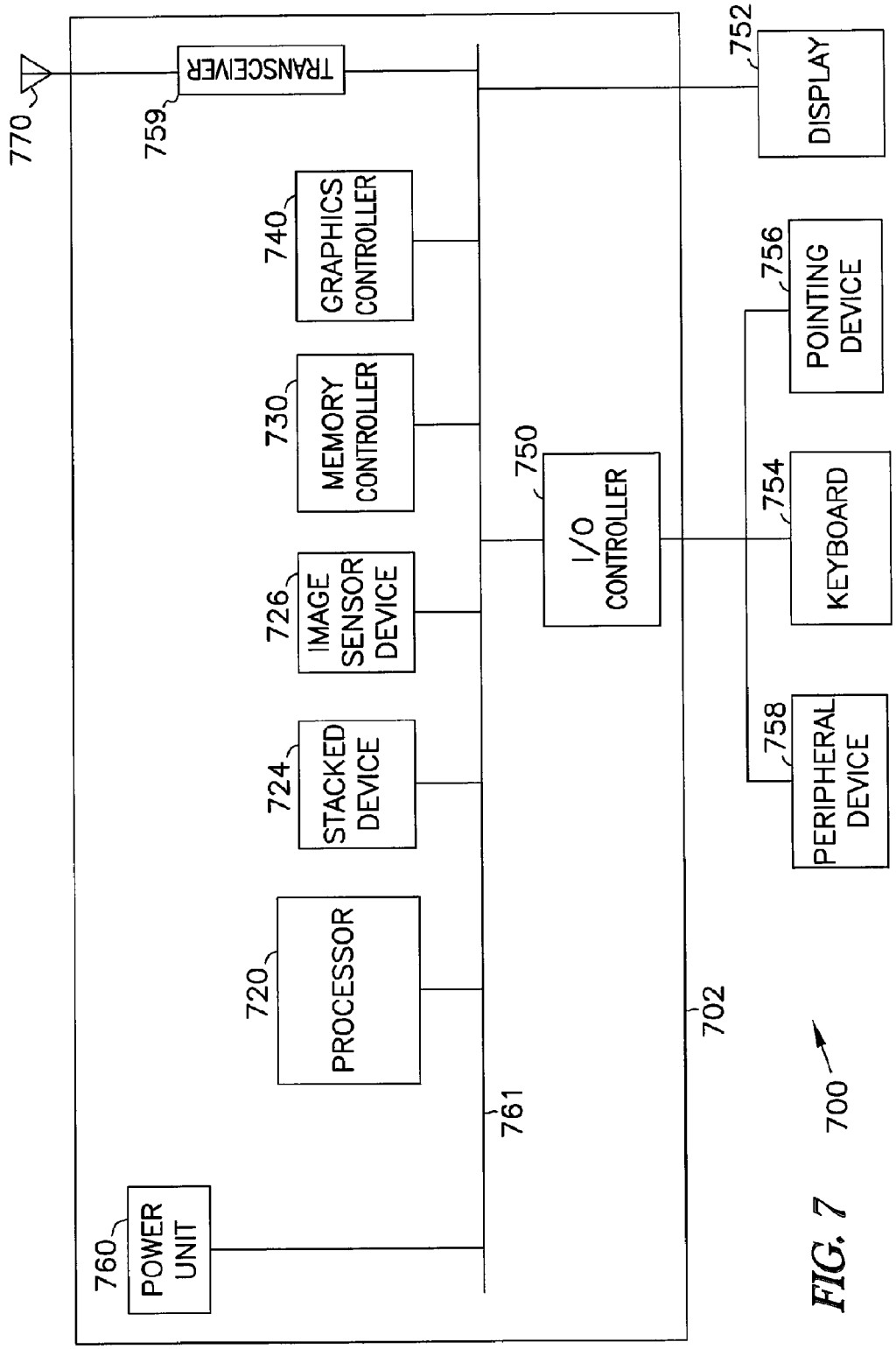
FIG. 7 shows a system including a stacked device according to various embodiments of the invention.

FIG. 7 shows a system 700 having a stacked device 724 according to various embodiments of the invention. System 700 may also include a processor 720, an image sensor device 726, a memory controller 730, a graphics controller 740, an input and output (I/O) controller 750, a display 752, a keyboard 754, a pointing device 756, a peripheral device 758, a system transceiver 759, a power unit 760, or a combination thereof. System 700 in FIG. 7 may further include a circuit board 702 where some of the components of system may be attached, and an antenna 770 to wirelessly transmit and receive information to and from system 700.

Power unit 760 may include a battery to supply a direct current (DC) power source to components of system 700 such as to stacked device 724. Power unit 760 may also include an alternating current to direct current converter (AC-DC converter) to supply power to system 700 from a power source such as an AC electrical power outlet. System 700 in FIG. 7 may also include a bus 761 to transfer information among the components of system 700 and to provide power to at least some of these components. Bus 761 may include various supply nodes at various locations in system 700 to provide power. The various supply nodes may include nodes that are similar to or identical to supply nodes 398 and 399 of FIG. 3.

Image sensor device 720 may include a complementary metal-oxide-semiconductor (CMOS) image sensor having a CMOS pixel array or charge-coupled device (CCD) image sensor having a CCD pixel array.

Display 752 may include an analog display or a digital display. Display 752 may receive information from other components. For example, display 752 may receive information that is processed by one or more of processor 720, stacked device 724, image sensor device 726, and graphics controller 740 to display information such as text or images.

Processor 720 may include a general-purpose processor, an application specific integrated circuit (ASIC), or other types of processors. Processor 720 may include a single core processor or a multi-core processor. Processor 720 may execute one or more programming commands to process information.

The information may include information provided by other components of system 700, memory device 710 or image sensor device 726.

Stacked device 724 may include various embodiments of apparatus 100 of FIG. 1, stacked device 200 of FIG. 2, or apparatus 300 of FIG. 3. Stacked device 724 may include a volatile memory device, a non-volatile memory device, or a combination of both. For example, stacked device 724 may include a dynamic random access memory (DRAM) device, a static random access memory (SRAM) device, a flash memory device, phase change memory device, or a combination of these memory devices.

The illustrations of apparatus (e.g., apparatuses 100 and 300 and stacked device 200) and systems (e.g., system 700) are intended to provide a general understanding of the structure of various embodiments and are not intended to provide a complete description of all the components and features of apparatus and systems that might make use of the structures described herein.

Any of the components described above can be implemented in a number of ways, including simulation via software. Thus, apparatus (e.g., apparatuses 100 and 300 and stacked device 200) and systems (e.g., system 700) described above may all be characterized as "modules" (or "module") herein. Such modules may include hardware circuitry, single and/or multi-processor circuits, memory circuits, software program modules and objects and/or firmware, and combinations thereof, as desired by the architect of the apparatus (e.g., apparatuses 100 and 300 and stacked device 200) and systems (e.g., system 700), and as appropriate for particular implementations of various embodiments. For example, such modules may be included in a system operation simulation package, such as a software electrical signal simulation package, a power usage and distribution simulation package, a capacitance-inductance simulation package, a power/heat dissipation simulation package, a signal transmission-reception simulation package, and/or a combination of software and hardware used to operate or simulate the operation of various potential embodiments.

The apparatus and systems of various embodiments may include or be included in electronic circuitry used in high-speed computers, communication and signal processing circuitry, single or multi-processor modules, single or multiple embedded processors, multi-core processors, data switches, and application-specific modules including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

One or more embodiments described herein apparatus and methods having circuitry to test continuity of conductive paths coupled to dice arranged in a stack. Other embodiments including additional apparatus and methods are described above with reference to FIG. 1 through FIG. 7.

The above description and the drawings illustrate some embodiments of the invention to enable those skilled in the art to practice the embodiments of the invention. Other embodiments may incorporate structural, logical, electrical, process, and other changes. In the drawings, like features or like numerals describe substantially similar features throughout the several views. Examples merely typify possible variations. Portions and features of some embodiments may be included in, or substituted for, those of other embodiments. Many other embodiments will be apparent to those of skill in the art upon reading and understanding the above description.

The Abstract is provided to comply with 37 C.F.R. §1.72(b) requiring an abstract that will allow the reader to quickly ascertain the nature and gist of the technical disclosure. The Abstract is submitted with the understanding that it will not be used to interpret or limit the claims.

What is claimed is:

1. A method comprising:
    electrically coupling each conductive path of a number of conductive paths to at least one of a first supply node and a second supply node, one of the conductive paths including conductive material inside a via, the via extending at least partly through a die of a number of dice arranged in a stack;
    receiving signals from the conductive paths; and
    determining continuity of the conductive paths based on the signals without using a boundary scan, wherein determining the conductivity includes applying a number of patterns of bits to the dice to alternately and electrically couple a first group of the conductive paths and a second group of conductive paths between the first and second supply nodes, and comparing values of signals from the conductive paths with expected values.

2. The method of claim 1, wherein electrically coupling each conductive path includes:
    electrically coupling a first group of the conductive paths to the first supply node; and
    electrically coupling a second group of the conductive paths to the second supply node.

3. The method of claim 2, wherein electrically coupling each conductive path includes:
    electrically coupling the first group of the conductive paths to the second supply node; and
    electrically coupling the second group of the conductive paths to the first supply node.

4. The method of claim 2, wherein electrically coupling each conductive path includes electrically coupling the first conductive path to the first supply node through a second transistor located at a second die of the dice.

5. The method of claim 1, wherein electrically coupling each conductive path includes electrically coupling a first conductive path of the conductive paths to the first supply node through a first transistor located at a first die of the dice.

6. The method of claim 5, wherein electrically coupling each conductive path includes:
    electrically coupling the first conductive path to the second supply node through a third transistor located at the first die; and
    electrically coupling the first conductive path to the second supply node through a fourth transistor located at the second die.

7. The method of claim 1, wherein the number of patterns is less than $2^N$ where N is equal to the number of conductive paths.

8. The method of claim 1, wherein the number of the conductive paths is greater than four, and a number of bits of each of the patterns is equal to four.

9. A method comprising:
    electrically coupling a first segment of a conductive path to a supply node through a first transistor, the first segment being located at a first die of a number of dice arranged in a stack;
    electrically coupling a second segment of the conductive path to the supply node through a second transistor, the second segment being located at a second die of the dice;

receiving signals from the conductive path that includes the first and second segments when at least one of the first and second segments is electrically coupled to the supply node;

electrically coupling the first segment to an additional supply node;

electrically coupling the second segment to the additional supply node; and receiving additional signals from the conductive paths when at least one of the first and second segments is electrically coupled to the additional supply node.

10. The method of claim 9, further comprising:
comparing expected values with values of the signals received from the conductive paths.

11. The method of claim 9, wherein the first and second segments are concurrently and electrically coupled to the supply node.

12. The method of claim 9, wherein the first and second segments are not concurrently and electrically coupled to the supply node.

13. The method of claim 9, further comprising:
comparing expected values with values of the signals received from the conductive paths.

14. The method of claim 9, wherein the first and second segments are concurrently and electrically coupled to the additional supply node.

15. The method of claim 9, wherein the first and second segments are not concurrently and electrically coupled to the additional supply node.

16. A method comprising:
applying power to first and second supply nodes of a stacked device, the stacked device including dice, conductive paths coupled to the dice, first transistors, and second transistors, each of the first transistors coupled between the first supply node and one of the conductive paths, each of the second transistors coupled between the second supply node and one of the conductive paths;

determining continuity of the conductive paths based on the signals without using a boundary scan, wherein determining the conductivity includes applying a number of patterns of bits to the dice to alternately and electrically couple a first group of the conductive paths and a second group of conductive paths between the first and second supply nodes, and comparing values of signals from the conductive paths with expected values; and turning off the first transistors and the second transistors while the power is applied to the first and second supply nodes.

17. The method of claim 16, wherein turning off the first transistors and the second transistors includes applying a signal having a first value to each transistor of the first transistors, and applying a signal having a second value to each transistor of the second transistors.

18. The method of claim 16, wherein the first supply node has a value greater than a value of the second supply node, and the value of the second supply node includes a ground potential.

* * * * *